United States Patent [19]
Hashimoto et al.

[11] Patent Number: 5,638,012
[45] Date of Patent: Jun. 10, 1997

[54] WRITE DRIVER CIRCUIT

[75] Inventors: Takashi Hashimoto, Ome; Noriaki Hatanaka, Chigasaki; Masaki Yoshinaga, Higashiyamato; Yuji Nagaya; Tsuyoshi Hirose, both of Ome; Yuji Soga, Oi-machi; Tadao Kaji, Hinode-machi, all of Japan

[73] Assignees: Hitachi, Ltd., Tokyo; Hitachi Computer Engineering Co., Ltd., Kanagawa, both of Japan

[21] Appl. No.: 544,824

[22] Filed: Oct. 18, 1995

[30] Foreign Application Priority Data

Oct. 24, 1994 [JP] Japan ................................ 6-284490

[51] Int. Cl.⁶ .............................. H03K 3/00; H02M 7/162
[52] U.S. Cl. .......................... 327/110; 327/478; 327/588; 360/68; 360/46
[58] Field of Search .................................. 327/110, 108, 327/478, 588, 309, 324, 327, 427; 360/46, 67, 68

[56] References Cited

U.S. PATENT DOCUMENTS

| | | | |
|---|---|---|---|
| 3,731,004 | 5/1973 | Cowpland et al. | 327/110 |
| 4,490,655 | 12/1984 | Feldman | 327/110 |
| 4,639,794 | 1/1987 | Ferrier | 360/68 |
| 5,291,347 | 3/1994 | Ngo et al. | 360/46 |
| 5,469,095 | 11/1995 | Peppiette et al. | 327/110 |
| 5,550,502 | 8/1996 | Aranovsky | 327/110 |

OTHER PUBLICATIONS

ISSCC "94 Session 17/Disk-Drive Electronics/Paper FA17.6", pp. 286-287.

*Primary Examiner*—Toan Tran
*Attorney, Agent, or Firm*—Fay, Sharpe, Beall, Fagan, Minnich & McKee

[57] ABSTRACT

A write driver for writing write data to a magnetic disk. The write driver is provided with first and second pnp type input transistors whose bases are each supplied with a pair of complementary input signals, and first and second npn type output transistor in the form of an inverted Darlington arrangement. A first resistor element is provided between the emitter of a corresponding pnp type input transistor and the collector of a npn type output transistor, whereas a second resistor element is provided between the common collector of the first and second npn type output transistors and supply voltage. The collectors of the first and second pnp type transistor are supplied with clamp voltage. Third and fourth npn type output transistors each connected to the first and second npn type output transistors in series and subjected to complementary switching control are provided to form a bridge circuit and to drive an inductive head.

9 Claims, 12 Drawing Sheets

WRITE DRIVER CIRCUIT

BACKGROUND OF THE INVENTION

The present invention relates to a read/write integrated circuit, and more particularly to technology effectively utilizable for producing a composite head using, for example, a MR (magneto-resistance effect element) head as a read head, and an inductive head as a write head.

FIG. 13 shows a circuit that the present inventors studied prior to the present invention. This circuit comprises a pair of pnp type transistors QP1, QP2 as a pair on the upper side, and npn type transistors Q3, Q4 as a pair on the lower side. An input signal WD which is a low-level signal is used to turn on the transistors QP1, Q4, so that current is caused to flow from a first connection to a second connection. The first connection is a point at which the collector of the transistor QP1 and one end of a magnetic head L are coupled together, whereas the second connection is a point at which the collector of the transistor Q4 and the other end of magnetic head L are coupled together. When an input signal WDN is a low-level signal, the transistors QP2, Q3 turn on, so that current is caused to flow into the magnetic head L from the second connection to the first connection, that is, in the direction opposite to the preceding case.

An example of a current-control type magnetic head driving circuit is given in ISSCC "94 SESSION 17/DISK-DRIVE ELECTRONICS/PAPER FA17-6, PP 286~287.

SUMMARY OF THE INVENTION

In the above current-control type magnetic head driving circuit, the pnp type transistors QP1, QP2 are used as transistors on the upper side to make a necessary driving current flow therethrough and consequently these transistors are large in size in comparison with a case where npn type transistors are employed. Moreover, the voltage at the head terminal can be raised up only to supply voltage VCC. With the low voltage like this at the head terminal, it takes much time to cause the energy stored in the inductance component of the magnetic head to be released when write current is switched, whereby high-speed operation is restricted. The problem is that a dumping resistor so provided as optimize the control of write current to be switched not only allows useless current to flow in the steady state but also decreases substantial write current flowing through the magnetic head.

The present inventors reasoned about the utilization of an inverted Darlington circuit comprising a pnp type transistor and an npn type transistor as upper-side write transistors. In addition to the aforementioned problems, there is the possibility to provide a multi servo operation for facilitating the simultaneous writing operation by simultaneously operating all magnetic heads to write position data (servo data) quickly to the plurality of magnetic disks in a read/write integrated circuit loaded with a plurality of write drivers. However, the head terminal corresponding to such a write driver is held open in a system in which the number of disk faces is less than that of write driver circuits loaded on the read/write integrated circuit. Therefore, the use of the aforesaid inverted Darlington circuit causes a large write current to flow into the input side of the pnp type transistor. Obviously, the problem in this case is that the write current exceeds its allowable current value.

An object of the present invention is to provide a write driver circuit capable of high-speed writing operation at a low supply voltage. Another object of the present invention is to provide a write driver circuit capable of multi servo operation. Still another object of the present invention is to provide a write driver circuit capable of setting write current with high precision. These and other objects, novel features of the present invention will become more apparent in the detailed description together with the accompanying drawings of the invention.

A brief description will subsequently be given of an exemplary embodiment of the invention as disclosed in the present application for a patent. A first and a second npn type output transistor in an inverted Darlington form are provided for a first and a second pnp type input transistor whose bases are respectively supplied with complementary input signals in pair. Further, a first resistor element is provided between the emitter of the pnp type input transistor and the collector of the corresponding npn type output transistor, whereas a second resistor element is provided between the common collectors of the first and second npn type output transistors and supply voltage, clamp voltage being supplied to the collectors of the first and second pnp type input transistors. Further, there are provided a third and a fourth npn type output transistor connected to the first and second npn type output transistors in series and subjected to complementary switching control. The connection between the first and third output transistors and the connection between the second and fourth output transistors are each used as a first and a second output terminals, and respective inductive heads are connected therebetween.

Since the voltage between the output terminals at the time the current is switched can be set higher than the supply voltage in response to the withstand voltage between the base and emitter of the npn type output transistor, the high-speed switching of the write current is made possible. In the circuit kept open during the multi servo operation, the current limitation can effectively be carried out by the first resistor element provided for the emitter of the pnp type input transistor.

DESCRIPTION OF THE PREFERRED EMBODIMENTS

Figure 1:
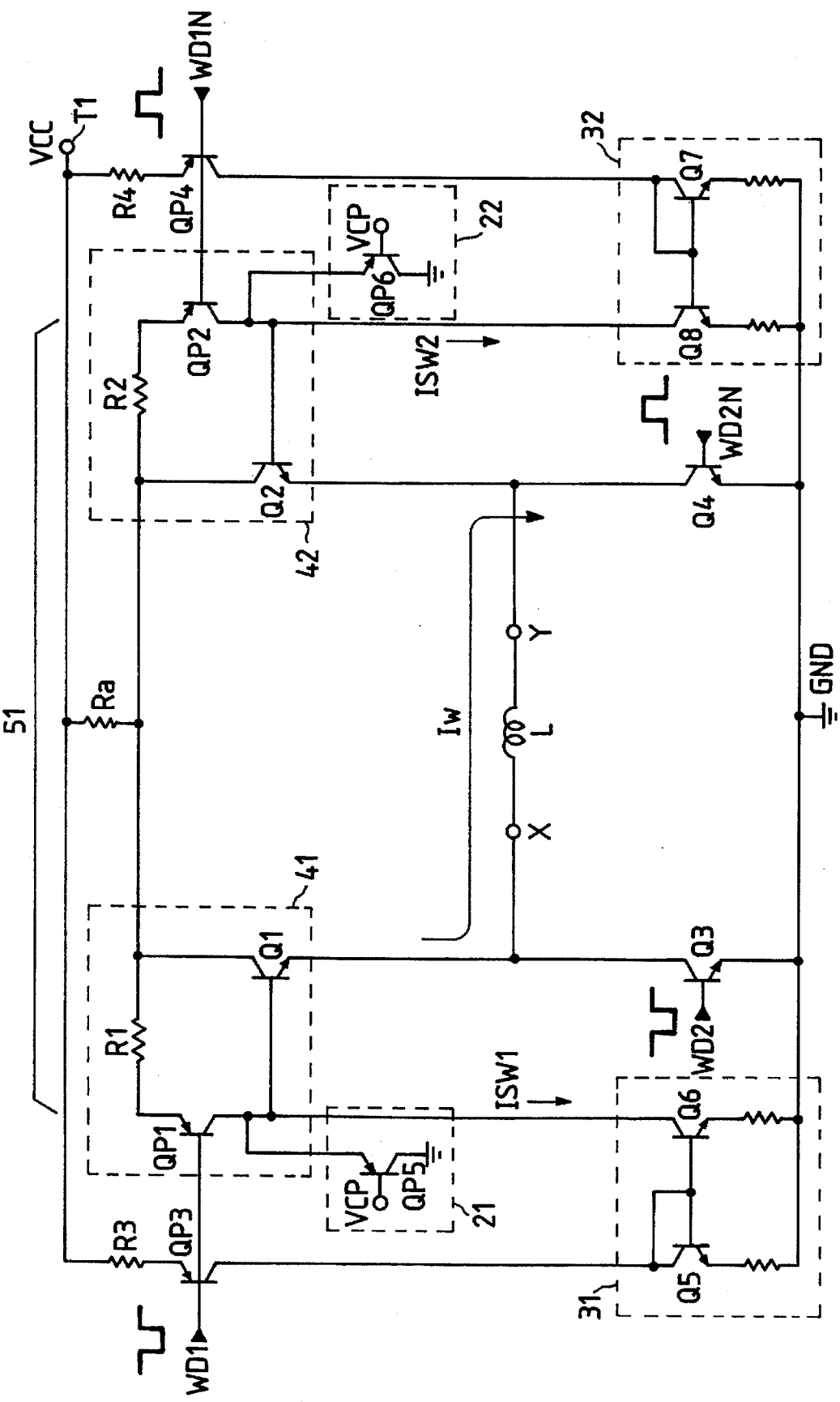
FIG. 1 is a circuit diagram showing an embodiment of a write driver circuit of the invention.

FIG. 1 is a circuit diagram showing a write driver circuit embodying the invention. With respect to the circuit elements shown in FIG. 1, known semiconductor integrated circuit technology is used for forming them on one semiconductor substrate of, for example, single crystal silicon.

A write amplifier 51 in the write driver circuit according to this embodiment of the invention employs an inverted Darlington circuit 41 including a pnp type transistor QP1 and an npn type transistor Q1 as one of the upper-side circuits. More specifically, one input signal WD1 is supplied to the base of the pnp type transistor QP1, and the collector output of the pnp type transistor QP1 is supplied to the base of the npn type transistor Q1. Another inverted Darlington circuit 42 including a pnp type transistor QP2 and an npn type transistor Q2 is provided as a circuit similar in configuration and arranged on the other upper side. An inverted signal WD1N relative to the input signal WD1 is supplied to the base of the pnp type transistor QP2. In other words, the input signals WD1, WD1N are complementary input signals.

According to the present embodiment of the invention, emitter resistors R1, R2 are provided for the emitters of the respective pnp type transistor QP1, QP2 to prevent a large write current from flowing into the transistor QP1 or QP2 in the circuit which is opened during a multi-servo operation. To the collectors of the npn type transistors Q1, Q2 and the emitter resistors R1, R2, a first supply voltage VCC is supplied from an external power supply terminal T1 via a resistor Ra.

A lower-side npn type transistor Q3 is provided for the emitter of the transistor Q1, the npn type transistor Q3 being subjected to switching control in a mode complimentary to the emitter thereof. Equally, a lower-side npn type transistor Q4 is provided for the emitter of the transistor Q2, the npn type transistor Q4 being also subjected to switching control in a mode complimentary to the emitter thereof. These transistors Q1~Q4 constitute a bridge circuit. An input signal WD2 is supplied to the base of the transistor Q3, whereas an input signal WD2N is supplied to the base of the transistor Q4. To emitters of the transistors Q3, Q4, a second supply voltage, for example, the ground potential GND is supplied.

When the input signals WD1, WD2 and the input signals WD1N, WD2N are respectively low- and high-level signals and when the latter is complementary to the former, the pnp type transistor QP1 turns on, causing the base current to flow into the transistor Q1, and the npn type transistor Q1 also turns on. At this time, the npn type transistor Q4 turns on because of the high level of the input signal WD2N, whereby write current Iw flows from an output terminal X to an output terminal Y as shown in FIG. 1. The inverted Darlington circuit 41 becomes a current source, and the value of the current Iw is determined by the voltage of the input signal WD1 and the resistor Ra.

While the write current Iw is flowing, bias current ISW1 and the base current of the npn type transistor Q1 are made to flow through the pnp type transistor QP1. The value of the combined current is set small and an element area to be formed for the pnp type transistor QP1 is made small correspondingly. Since only such a small current as noted above is allowed to flow through the emitter resistor R1, a slight voltage drop is caused therein and most of the voltage corresponding to the input signal WD1 is applied to the resistor Ra, whereby the value of the write current Iw is determined by the voltage of the input signal WD1 and the resistor Ra in normal condition.

Conversely, the npn type transistor Q2 turns on, because, when the levels of the input signals WD1, WD2 are high and when the levels of the other complementary input signals WD1N, WD2N are low, the pnp type transistor QP2 turns on causing the base current to flow into the npn type transistor Q2. Then the npn type transistor Q3 turns on because of the high level of the input signal WD2, thus causing the write current Iw to flow in the opposite direction, that is, from the output terminal Y to the output terminal X. Further, the inverted Darlington circuit 42 becomes a current source likewise, and the value of the write current Iw in the opposite direction is also determined by the voltage of the input signal WD1N and the resistor Ra.

According to the present embodiment of the invention, the bias currents ISW1, ISW2 are made to flow, though not exclusively, in response to the respective input signals WD1, WD1N. In other words, a bias circuit 31 for extracting the base current is provided because the operating rates of the pnp type transistors QP1, QP2 themselves are low. When the level of the input signal WD1 is low, the transistor QP3 causes the current to flow on receiving the signal, and the bias circuit 31 including npn type transistors Q5, Q6 also causes the bias current ISW1 to flow, so that the inverted Darlington circuit including transistors QP1, Q1 is quickly turned on. This is also the case with the other bias circuit 32.

Figure 4:
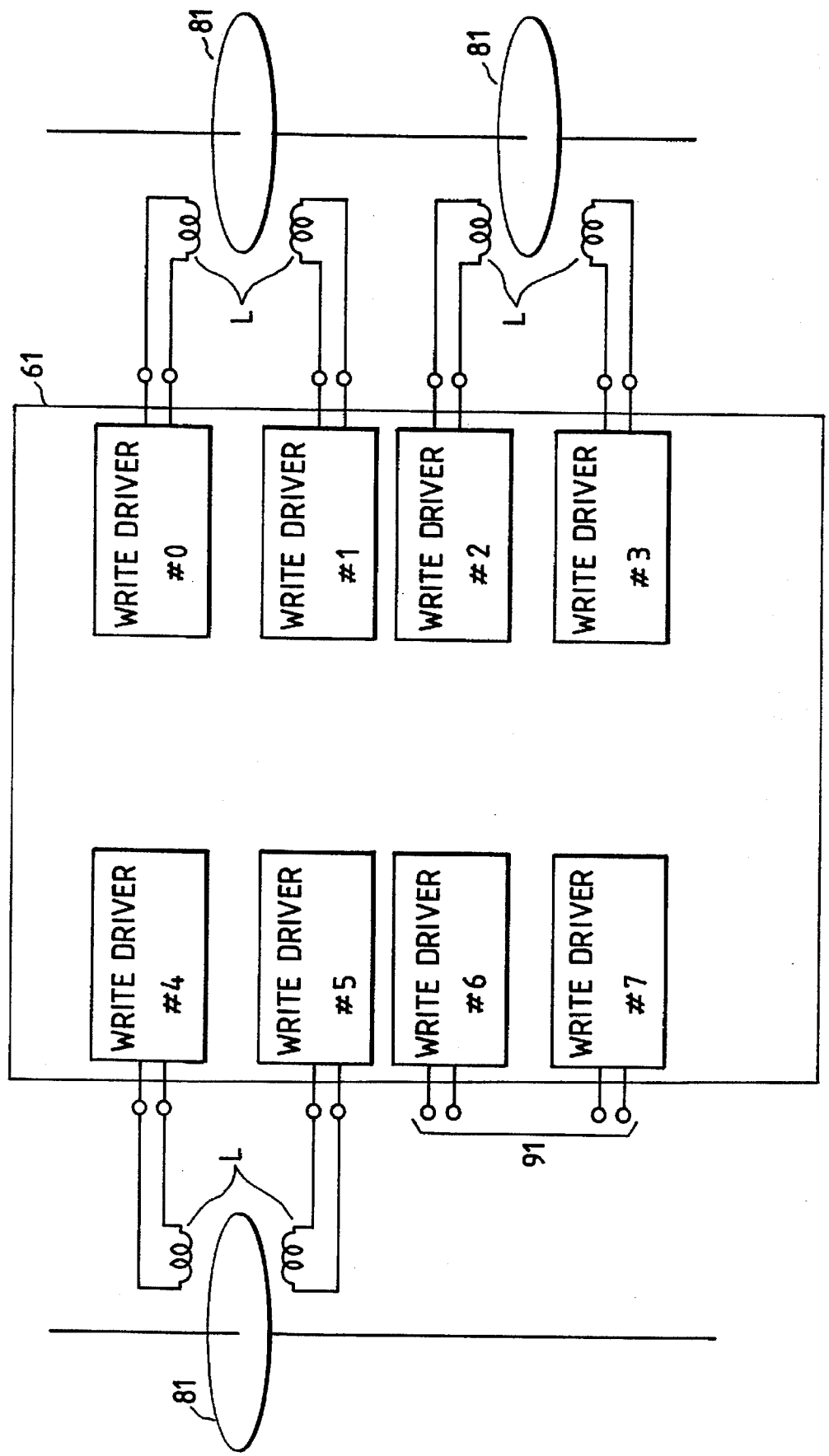
FIG. 4 is a schematic diagram of a read/write integrated circuit loaded with the write driver circuit according to the present invention.

FIG. 4 is a schematic block diagram of an embodiment of a read/write integrated circuit mounted on a write driver circuit of the invention. Write driver circuits #0–#7 respectively corresponding eight magnetic heads L are, though not exclusively, mounted on a integrated circuit 61. When, however, the read/write integrated circuit 61 is incorporated in a system, it doesn't follow that all the write driver circuits are used. In a system in which three magnetic disks 81 are mounted, for example, two write driver circuits are used above and below each disk, that is, six write driver circuits #0–#5 in total are used, whereby the output terminals 91 of the remaining two write driver circuits #6, #7 are placed in a high-impedance state.

In a magnetic disk apparatus using such a read/write integrated circuit including a plurality of write driver circuits, the operation of writing position data (servo data) to all disks is performed at least before shipment. As it takes much time to write the servo data to each magnetic disk and as it is inefficient to do so, the provision of a multi servo function is convenient as it serves to meet the requirement for the servo data to be written to all the magnetic disks at a time by simultaneously operating them.

Figure 2:
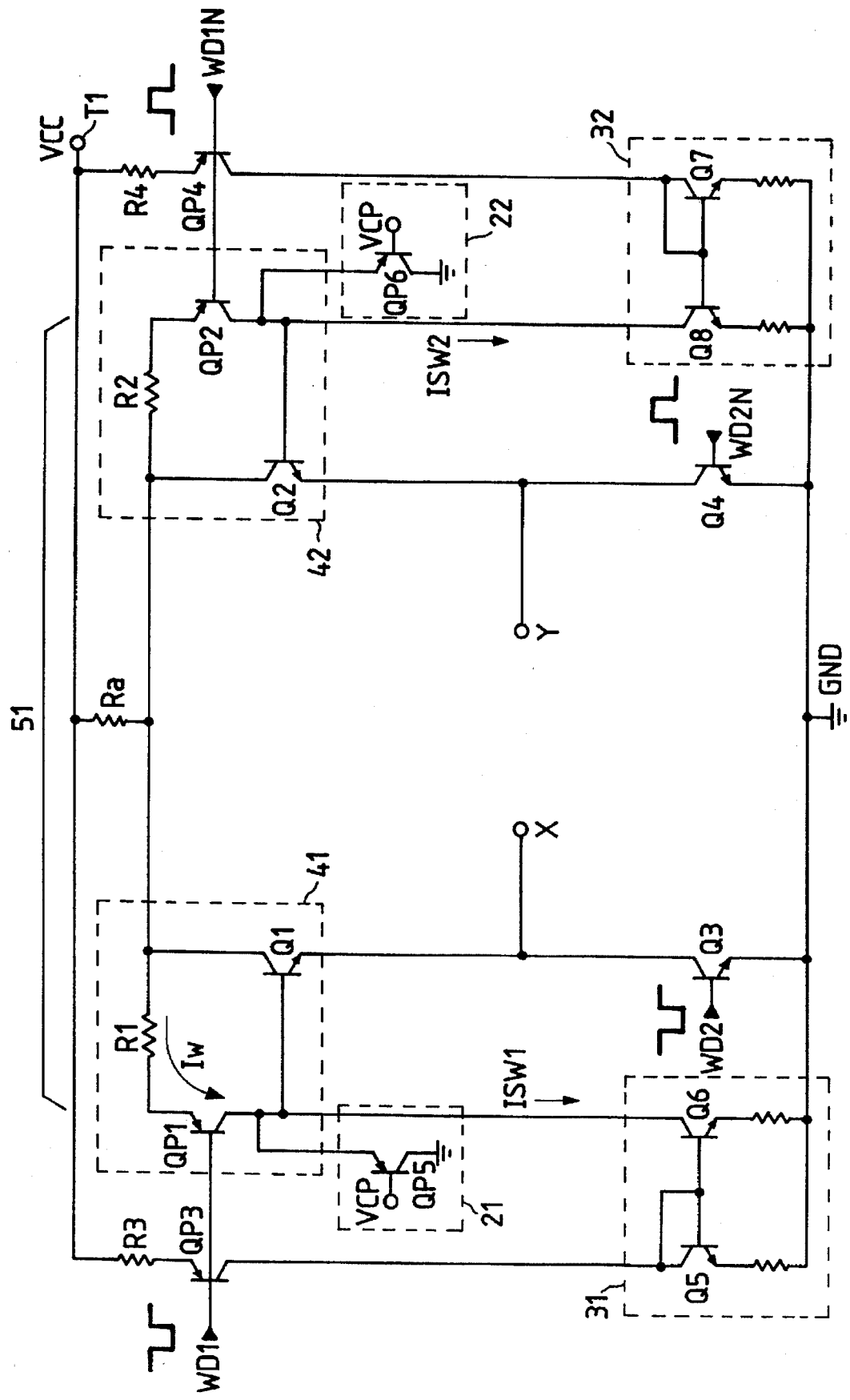
FIG. 2 is a circuit diagram showing the inactive condition of the write driver circuit according to the present invention.

FIG. 2 is a circuit diagram of a write driver circuit which is not used. More specifically, no magnetic head L as a load is connected to the output terminals X, Y. The multi servo write function thus provided allows the write current to flow through the write driver circuit to which the magnetic head L is not connected like any other write driver circuit to which the magnetic head L is connected.

In such a state that no magnetic head is connected, the level of the input signal WD1 becomes low and the pnp type transistor QP1 turns on and even when the transistor Q1 turns on accordingly, the whole write current Iw is made to flow through the pnp type transistor QP1 since the emitter of the transistor Q1 is in the high-impedance state. In the circuit to which the magnetic head L is connected as state above, the pnp type transistor QP1 causes only the base current of the transistor Q1 and the bias current ISW1 to flow, so that the pnp type transistor QP1 thus formed is small in size. Therefore, if normal write current is allowed to flow directly into the transistor QP1, the transistor QP1 will be broken down as the write current exceeds an allowable current value.

According to this embodiment of the invention, the resistor R1 is connected to the emitter of the pnp type transistor QP1 to prevent the breakdown of the element. While the output terminal is in the high-impedance state as described above, the write current flows into the pnp type transistor on the input side and the resistors R1, Ra are inserted in series with respect to the input voltage WD1. In other words, the current Iw' caused to flow at this time is reduced to Ra/(R1+1) of the normal write current Iw so as to prevent the breakdown of the element.

Figure 3:
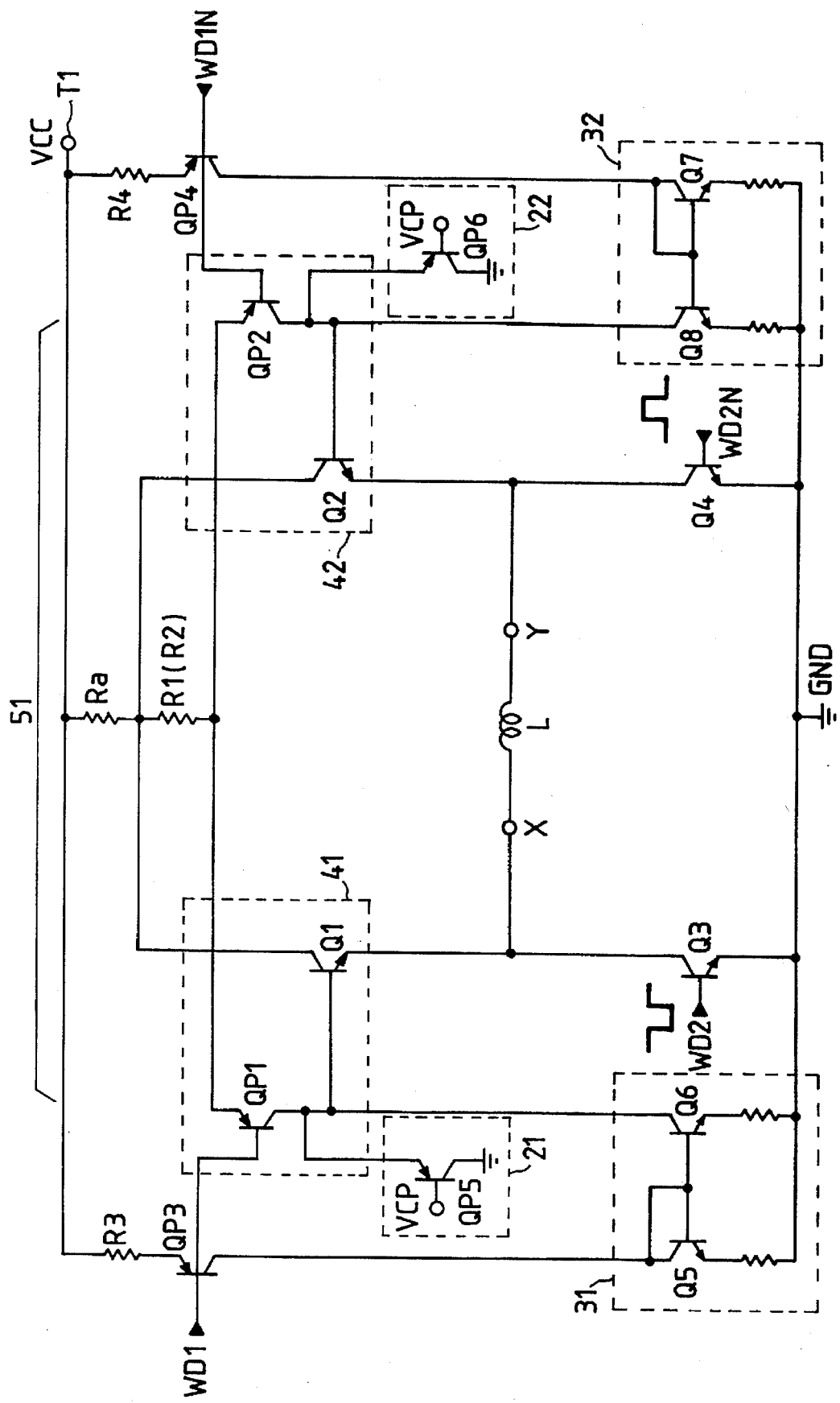
FIG. 3 is a circuit diagram showing another embodiment of the write driver circuit of the invention.

FIG. 3 is a circuit diagram showing another embodiment of the write driver circuit of the invention. According to this embodiment of the invention, the resistors R1, R2 are combined together for common use to decrease the number of elements. More specifically, the resistor R1 is commonly connected to the emitters of the pnp type transistors QP1, QP1 adapted for common use. According to this embodiment of the invention, the inverted Darlington circuits 41, 42 are such that when one of them is ON, the other is always kept OFF in response to the complementary input signals WD1, WD1N. Thus the resistors R1, R2 can be replaced with the resistor R1 or R2.

According to the embodiment of FIG. 1 or 3, the inverted Darlington circuits 41, 42 are each provided with voltage clamp circuit 21 or 22 for the following reason. When the levels of the input signals WD1, WD2 are low and when those of the input signals WD1N, WD2N are high, the write current flows from the output terminal X toward the output terminal Y. When the levels of the input signals WD1, WD2 are switched to high and when those of the input signals WD1N, WD2N are switched to low, the pnp type transistor QP1 and the npn type transistors Q1, Q4 turns off, whereas the pnp type transistor QP2 and the npn type transistors Q2, Q3 turns on, whereby the write current Iw is switched so as to flow in the opposite direction.

When the write current Iw is inverted at high speed, a counter-electromotive voltage of L·dIw/dt is generated between the head terminals X, Y. The voltage at the output terminal X reaches the ground potential 0V of the circuit+the voltage across the collector-emitter of the transistor Q3 (about 0.4V). The voltage at the output terminal Y rises with the voltage at the output terminal X as a reference and since the npn type transistor Q2 is ON, its base potential also rises correspondingly. At this time, the voltage clamp circuit 22 is provided to prevent the pnp type transistor QP2 from being saturated.

In other words, the potential at the collector of the pnp type transistor QP2 (the base of the npn type transistor Q2) is fixed at clamp voltage VCP+VBE. The voltage at the output terminal Y can still rise even though the voltage at the base of the npn type transistor Q2 is thus clamped. The voltage at the output terminal Y to which the emitter of the npn type transistor Q2 is connected can be raised to the extent that the inverse withstand voltage across the base-emitter of the npn type transistor Q2 permits.

Each of the voltage clamp circuits 21, 22 includes a pnp type transistor QP5 (QP6) whose emitter is coupled to the collector of the pnp type transistor QP1 (QP2), whose base is supplied with the clamp voltage and whose collector is supplied with the second supply voltage, for example, the ground potential GND.

Figure 7:
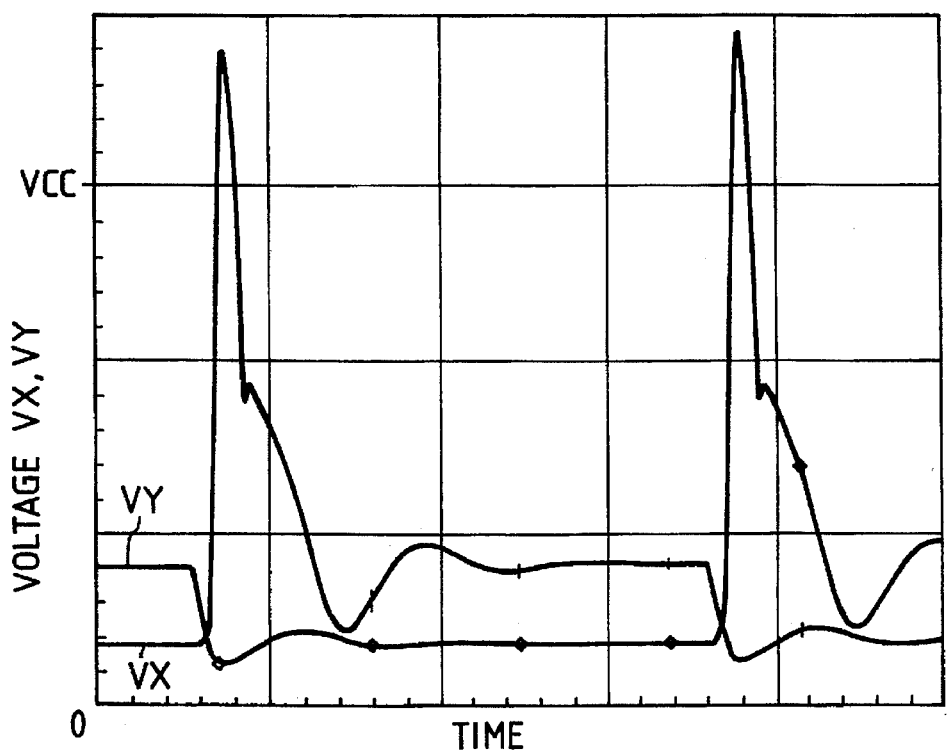
FIG. 7 is a voltage waveform chart illustrating an example of the operation of the write driver circuit according to the present invention.

As shown in a voltage waveform chart of FIG. 7, the counter-electromotive voltage can be raised up to a voltage higher than the supply voltage VCC, and the energy accumulated in the inductance component is released by the product of the voltage level and time. As the counter-electromotive voltage can be raised up to the voltage higher than the supply voltage VCC in this case, the energy accumulated in the inductance component is releasable within a short time, so that the write current can be switched quickly to the opposite direction. In FIG. 7, VX designates a voltage value at the output terminal X, and VY a voltage value at the output terminal Y.

The withstand voltage across the base-emitter of the transistor Q2 can be set to 8~9V in the normal process. Even when the supply voltage VCC is as low as 5V, the voltages VX-VY at the respective ends of the magnetic head can be set as high as over 10V, whereby quick current switching becomes possible as in the case where a voltage as high as 12V is used while the supply voltage VCC is as low as 5V. By making the voltage across the base-emitter of transistors Q1, Q2 resistant to higher voltage, the write current can be switched correspondingly and quickly.

Figure 5:
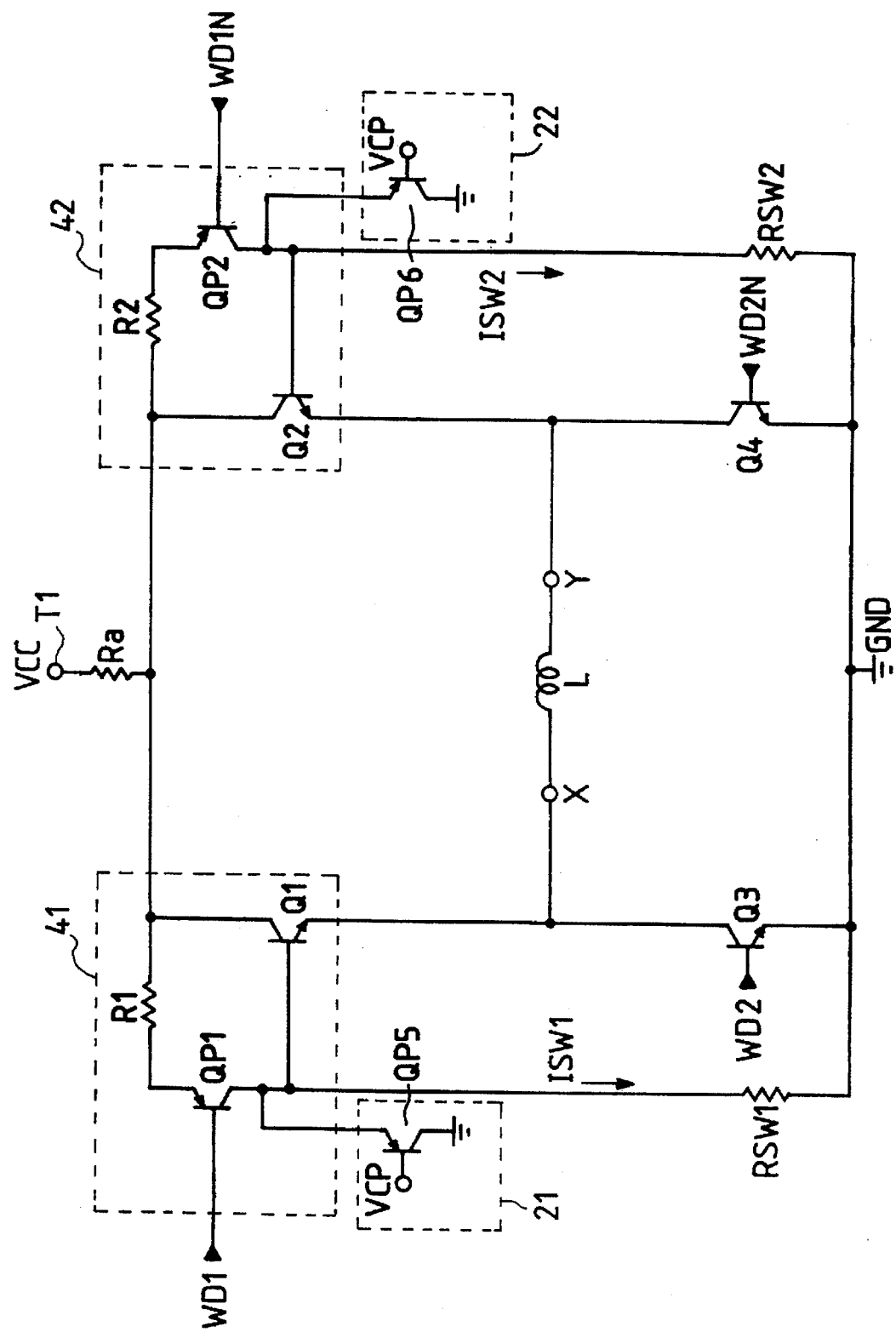
FIG. 5 is a circuit diagram showing still another embodiment of the write driver circuit of the invention.

FIG. 5 is a circuit diagram showing still another embodiment of the write driver circuit of the invention. According to this embodiment of the invention, the bias circuits 31, 32 in the embodiments of FIGS. 1 and 3 are replaced with resistors RSW1, RSW2, respectively. In other words, it is possible to cause bias currents ISW1, ISW2 substantially reduced to constant currents to flow by setting increased resistance values of the respective resistors RSW1, RSW2 against the voltage applied thereto. If necessary, moreover, such bias currents ISW1, ISW2 may be formed by combining the bias circuits 31, 32 of FIG. 1 or 3 with the high-level resistors RSW1, RSW2, respectively.

Figure 8:
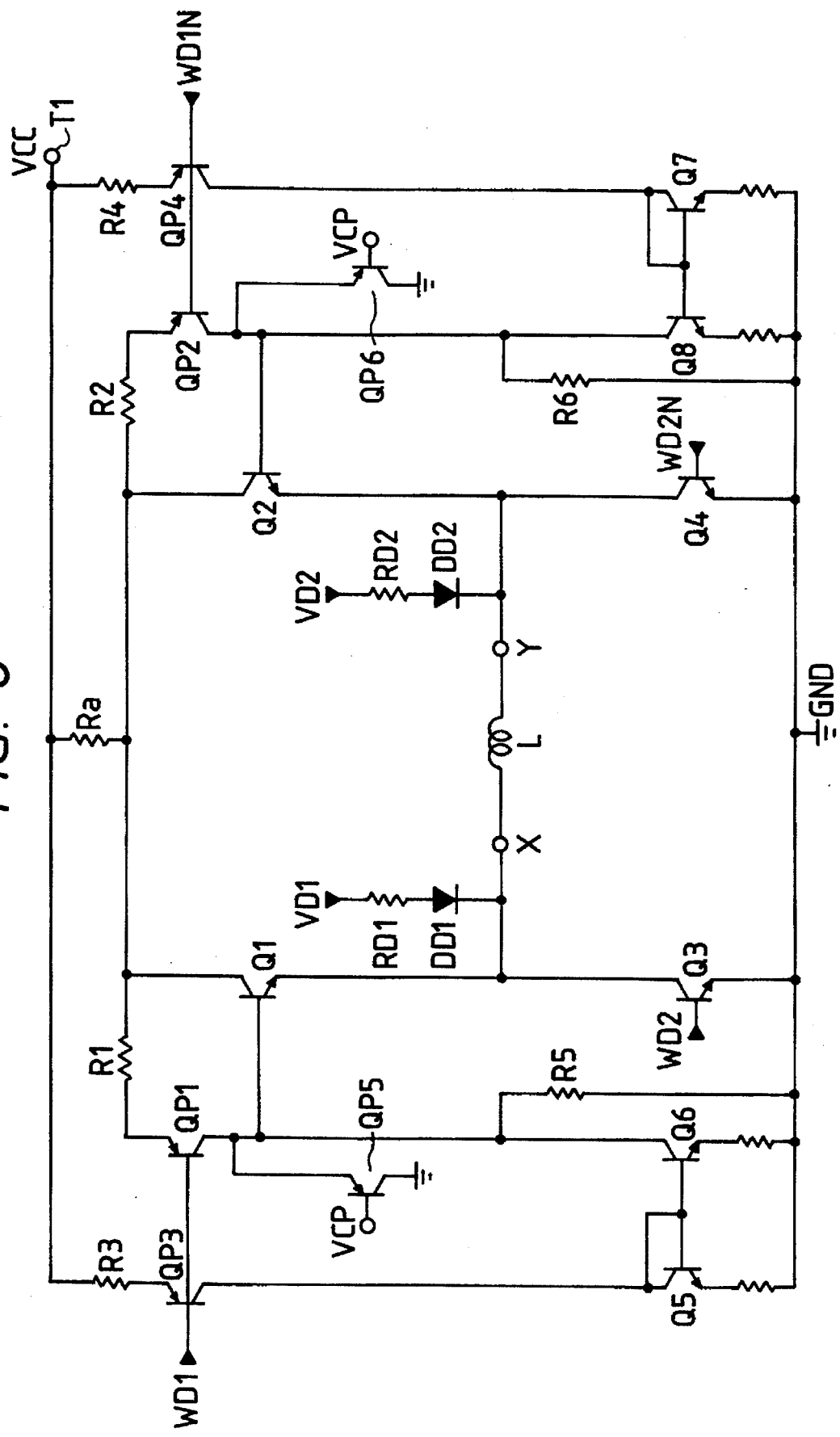
FIG. 8 is a circuit diagram showing still another embodiment of the write driver circuit of the invention.

FIG. 8 is a circuit diagram showing still another embodiment of the write driver circuit of the invention. According to this embodiment of the invention, dumping resistors RD1, RD2 are provided for the respective output terminals X, Y. In order to provide the write current efficiently, each of the dumping resistors RD1, RD2 is connected not with the supply voltage VCC but to a diode DD1 (DD2) as an unidirectional element in series and besides between the output terminal X (Y) and a voltage source VD1 (VD2) made to vary correspondingly with the input signal WD1 (WD1N).

Figure 6:
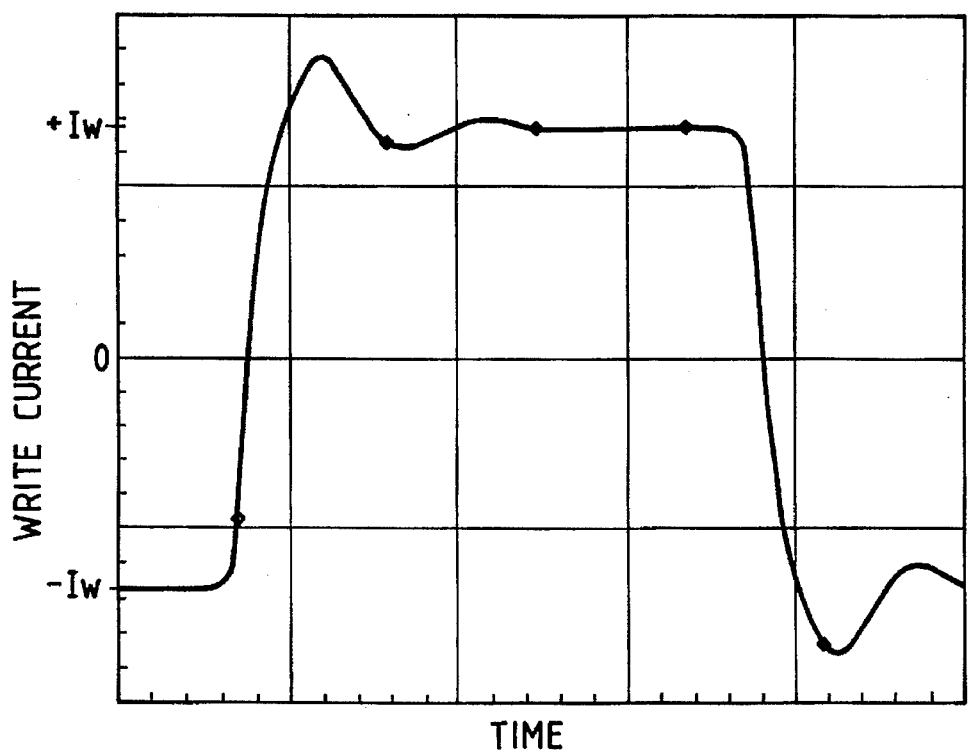
FIG. 6 is a current waveform chart illustrating an example of the operation of the write driver circuit according to the present invention.

The write current Iw is adapted for a second indicial response due to the inductance and resistance components, and parasitic capacitance of the magnetic head. The dumping resistors RD1, RD2 are provided for damping and optimizing the indicial response as shown in a waveform chart of FIG. 6. With the dumping resistor RD1 (RD2) provided between the output terminal X (Y) and the supply voltage VCC as before, reactive current is caused to flow through the dumping resistor provided at the output terminal on the low-level side. The reactive current is too large to ignore like (VCC—0.4)/RD1 since the low level at the output terminal is about 0.4V as described above.

According to this embodiment of the invention, each of the dumping resistors RD1, RD2 is not connected to the fixed supply voltage VCC as before but between the diode DD1 (DD2) and the voltage source VD1 (VD2) which varies with the input signal WD1 (WD1N). When the levels of the input signals WD1, WD2 are low and when those of the input signals WD1N, WD2N are high, the level of the voltage VD1 is set high, whereas that of VD2 is set low. Thus no reactive current is allow to flow since the level of the voltage VD2 corresponding to the output terminal Y on the low-level side is set substantially as low in level as the output terminal Y.

As the diodes DD1, DD2 are inserted in series, it is only necessary to set low the levels of voltages VD1, VD2 when no current is desired to flow into the dumping resistors RD1, RD2. While the levels of the voltage VD1, VD2 are low, the diodes DD1, DD2 are held OFF and the dumping resistors RD1, RD2 can thus be isolated from the output terminals X, Y.

Figure 9:
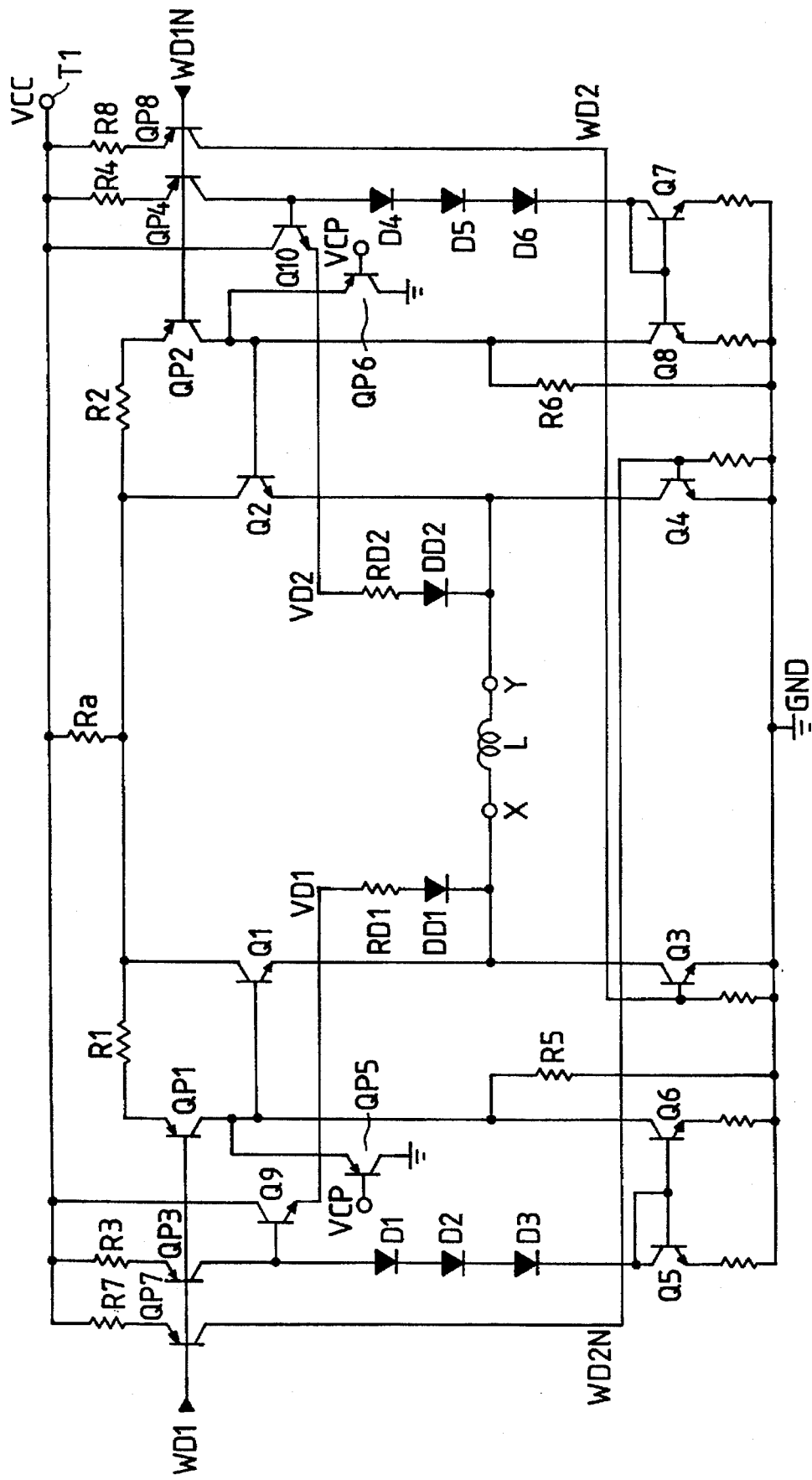
FIG. 9 is a specific circuit diagram showing an embodiment of the write driver circuit of the invention.

FIG. 9 is a specific circuit diagram showing an embodiment of the write driver circuit of the invention. According to this embodiment of the invention, a specific circuit of voltage sources VD1, VD2 each connected to the bias dumping resistors RD1, RD2 is shown. For the collectors of the pnp type transistors QP3, QP4 for driving the bias circuits, npn type emitter follower transistors Q9, Q10 are provided, and the dumping resistors RD1, RD2 are connected to the emitters of these transistors Q9, Q10, respectively.

When the levels of the input signals WD1, WD2 are low and when those of the input signals WD1N, WD2N are high, the transistor QP3 turns on and 3VG (VG=forward voltage) voltage formed by the serial diodes D1~D3 is supplied to the dumping resistor RD1 as a high-level voltage VD1. Since the transistor QP4 turns off due to the high-level input signal WD1N, on the other hand, the transistor Q10 turns off, thus stopping the current from flowing into the dumping resistor RD2. In other words, the same effect is achievable even though the current path is shut down as state above without reducing the potential to the low level in response to the low level of the output terminal Y.

When the levels of the input signals WD1, WD2 are high and when those of input signals WD1N, WD2N are low, moreover, the transistor QP4 turns on and the 3VG (VG= forward voltage) voltage formed by serial diodes D4~D6 is supplied to the dumping resistor RD2 as a high-level voltage VD2. Since the transistor QP3 turns off in response to the high level of the input signal WD1, on the other hand, the transistor Q9 turns off, thus stopping the current from flowing into the dumping resistor RD1. In other words, the same effect is achievable even though the current path is shut down as state above without reducing the potential to the low level in response to the low level of the output terminal X.

This embodiment also provides a circuit forming the inupt signals WD2 and WD2N to be supplied to the bases of the lower-side output transistors Q3, Q4. The input signals WD1, WD1N are supplied to the bases of pnp type transistors QP7, QP8. To the emitters of the transistors QP7, QP8, emitter resistors R7, R8 are respectively provided, with a load resistor provided between a collector and the circuit ground potential. In the figure, a resistor inserted between the base and emitter of the output transistor Q3(Q4) is a collector load resistor of the transistor QP7(QP8).

The input signal WD2 supplied to the base of transistor Q3 is inverted by the pnp type transistor QP8 whose base is supplied with the input signal WD1N, and made an input signal varying with the input signal WD1 in phase. Moreover, the input signal WD2N supplied to the base of the transistor Q4 is inverted by the pnp type transistor QP7 whose base is supplied with the input signal WD1, and made an input signal varying with the input signal WD1N in phase. Further, a current mirror circuit and resistors R5, R6 corresponding to the high-level resistors RSW1, RSW2 constitute the bias circuit.

Figure 10:
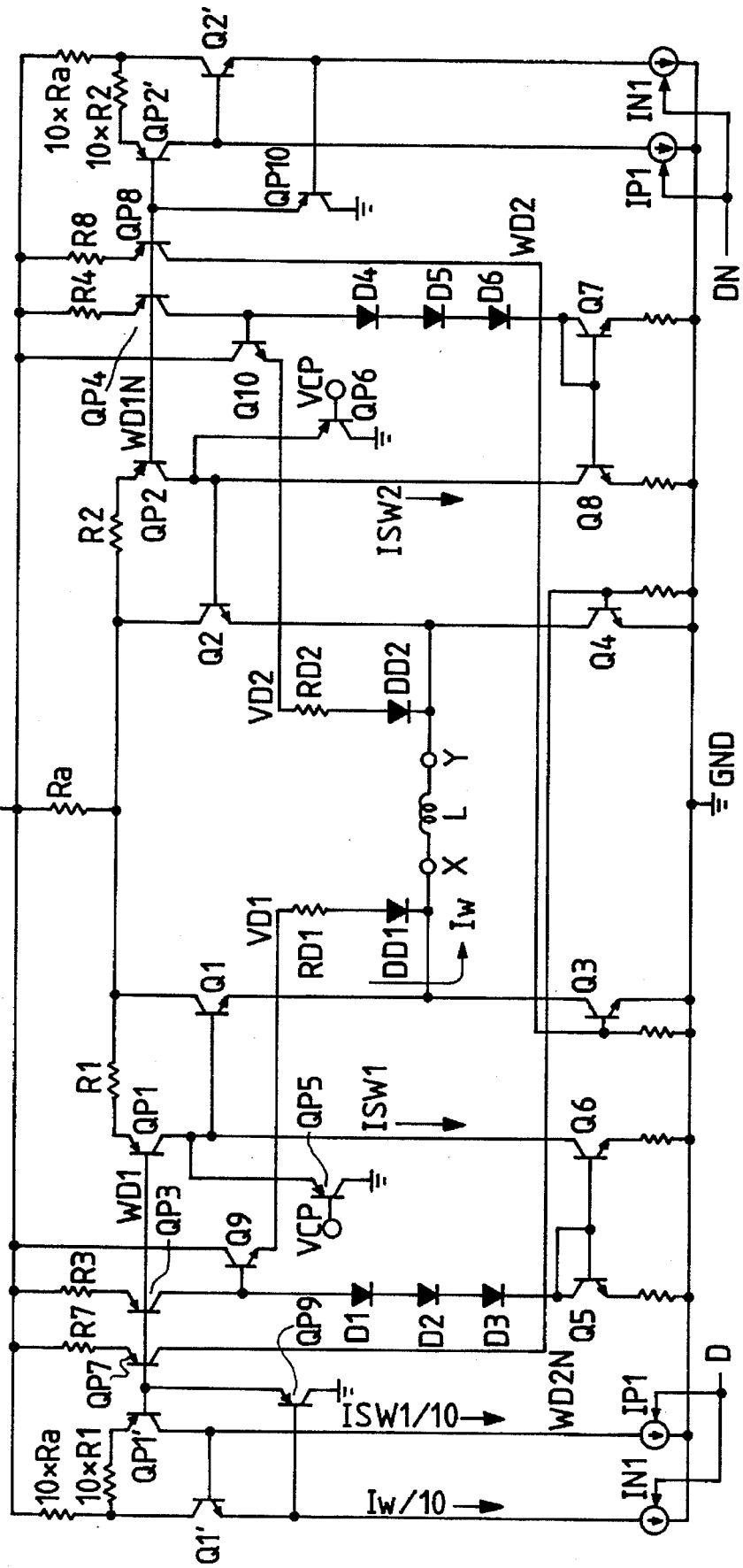
FIG. 10 is a specific circuit diagram showing another embodiment of write driver circuit of the invention.

FIG. 10 is a specific circuit diagram showing another embodiment of write driver circuit of the invention. According to this embodiment of the invention, a specific circuit for setting the write current Iw and the bias currents ISW1, ISW2 is shown. In this case, the currents Iw, ISW1, ISW2 are determined by the substantial current mirror circuit. In other words, as resistors provided for pnp type transistors QP1' and Q1', QP2' and Q2' that are arranged like the transistors QP1 and Q1, QP2 and Q2 each constituting the Darlington circuits, a resistor 10×Rs whose resistance value is 10 times as great as that of the resistor Ra, resistors 10×R1 and 10×R2 whose resistance values are also 10 times as great as those of the resistors R1, R2 are provided.

To the collectors of the transistors Q1', Q2', the constant current of a constant current source IN1, which is supplied from a host circuit 15 which will be described later, set at ⅟10 of the write current Iw is complementarily supplied in response to complementary input data D, DN, whereas to the collectors of the transistors Q1', Q2', the constant current of a constant current source IP1 set at ⅟10 of the write current Iw is complementarily supplied in response to complementary input data D, DN. The transistor QP1' (or QP2') through which the constant current Iw/10 flows and the base of the pnp type transistor QP1 (QP2) of the inverted Darlington circuit for forming the write current are adapted for common use. Since the resistance ratio of the resistor R1 to the resistor Ra provided on the emitter side is set at 10 to 1, the write current Iw that is output from the emitter of the transistor Q1 or Q2 is set as a current ten times as large as the constant current source IN1 with precision.

In other words, the write current Iw and the bias current ISW can be set with precision as the relative characteristics of the transistors QP1 and QP1', Q1 and Q1' can be matched with precision without being affected by the process of manufacturing in the semiconductor integrated circuit, and as the aforementioned resistance value ratio can also be formed with precision. The transistors QP9, QP10 each absorb the base currents of four pnp type transistors in total in which the bases are adapted for common use so that the current ratio is unaffected by these base currents. Thus it is possible to effect stable writing operations free from the fluctuation of the supply voltage.

Figure 11:
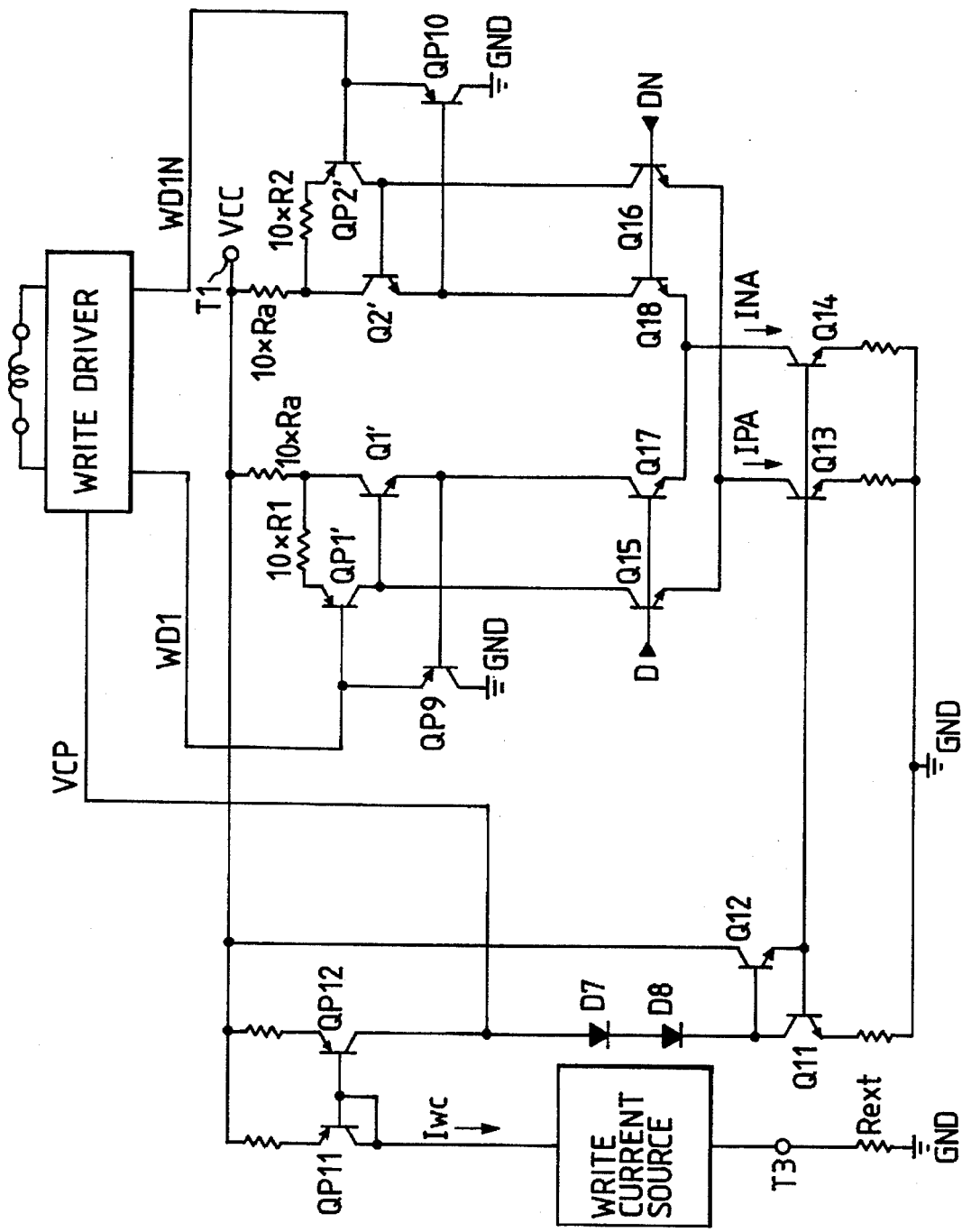
FIG. 11 is a specific circuit diagram showing an embodiment of an operating-current setting unit in the write driver circuit of the invention.

FIG. 11 is a specific circuit diagram showing an embodiment of an operating-current setting unit in the write driver circuit of the invention. According to this embodiment of the invention, a reference constant current is formed with a write current source. A desired reference constant current Iwc is formed in the write current source by applying the constant voltage formed by utilizing the base-emitter of the transistor Q and the like to an external resistor Rext connected via an external terminal T3. In the case where the external resistor Rext is employed, the variation of the constant voltage during processing is compensated for and any desired write current can be set in accordance with the magnetic disk apparatus in which the external resistor is mounted.

The reference constant current Iwc is converted to an extruding current by the current mirror circuit including pnp type transistors QP11, QP12, and the current is caused to flow into an npn type transistor Q11. Constant currents IPA, INA are formed by a transistor Q11 and transistors Q13, Q14 in the form of a current mirror. When the transistors Q11, Q12, Q13 are reduced to the same emitter size, the currents IPA, INA set to a high precision ratio with respect to the reference current Iwc can be obtained by setting the emitter resistance ratio set at the emitter to a desired ratio. The transistor Q12 operates as a source for supplying the base current to the transistors Q11, Q13, Q14 in the form of a such a current mirror to set the current ration with precision.

According to this embodiment of the invention, the aforementioned constant current Iwc is used to formed a stable clamp voltage VCP. More specifically, diodes D7, D8 are connected in series to the collector of the pnp type transistor QP12, and the clamp voltage VCP having about 2VF+2VBE is formed with the voltage between the base-emitter of the transistors Q11, Q12, and the forward voltages of the diodes D7, D8.

The constant currents IPA, INA are supplied to the emitters of differential transistors Q15, Q16, Q17, Q18 constituting a current switch circuit. Further, the complementary write data D, DN are supplied to the bases of these differential transistors Q15, Q17 and Q16, Q18, respectively. In other words, the transistors Q15, Q17 correspond to the constant current sources IP1, IN1 according to the embodiment of FIG. 10, whereas the transistors Q16, Q18 correspond to the constant current sources IP1, IN1.

The constant currents IP1, IN1 controlled by the aforementioned input data D, DN are made to flow through circuits (QP1', Q1 and resistors 10×Ra, 10×R1) and (QP2', Q2 and resistors 10×Ra, 10×R2) similar to the inverted Darlington circuits forming the upper-side circuits of the write driver and while the input signal WD1, WD1N are formed from the bases of the transistors QP1', QP2', supplied to the write driver circuit as shown by a black box of FIG. 11. Further, the clamp voltage VCP is also supplied to voltage clamp circuits 21, 22 included in the write driver circuit.

Figure 12:
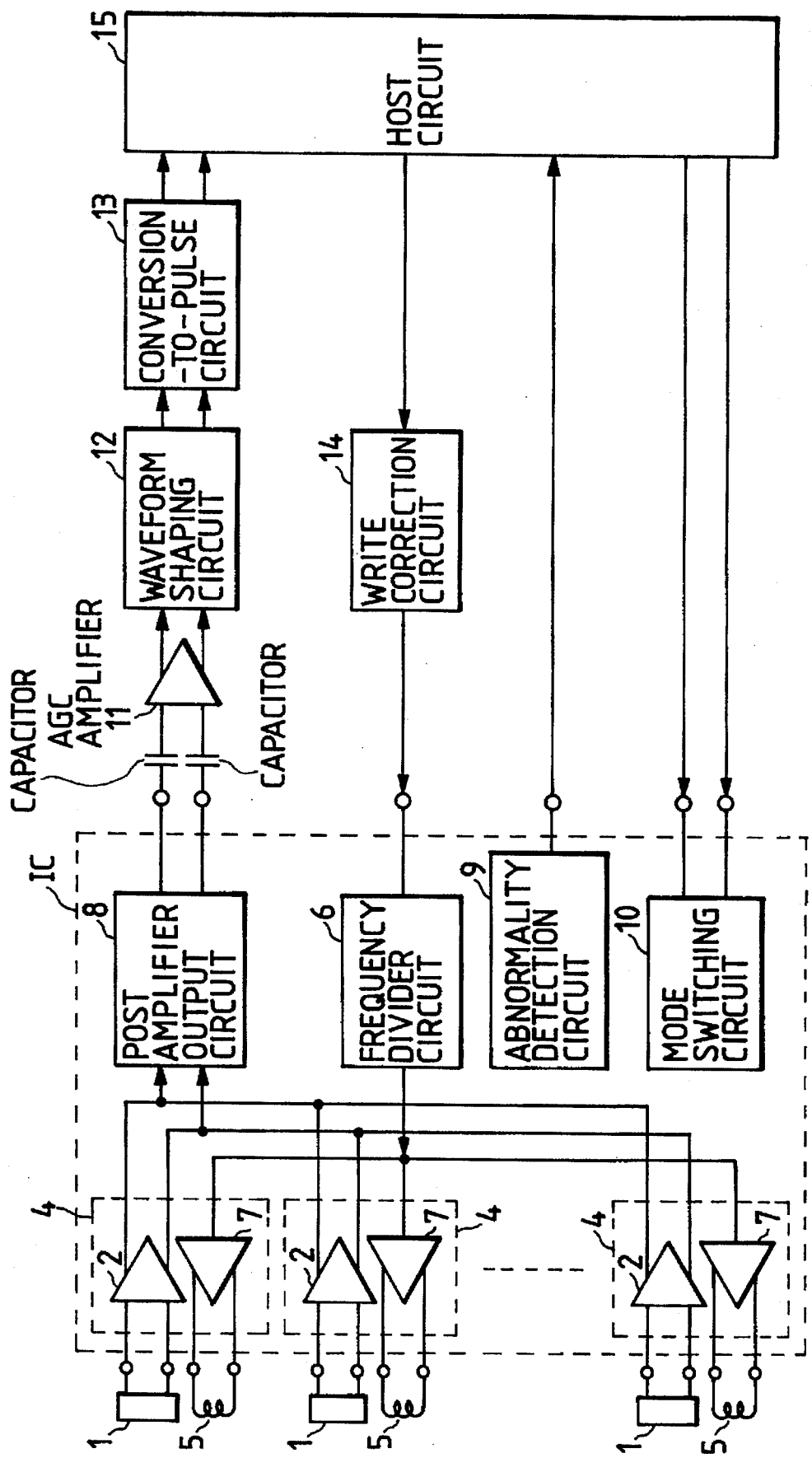
FIG. 12 is a block diagram of the principal part of a read/write integrated circuit embodying the invention.
Figure 13:
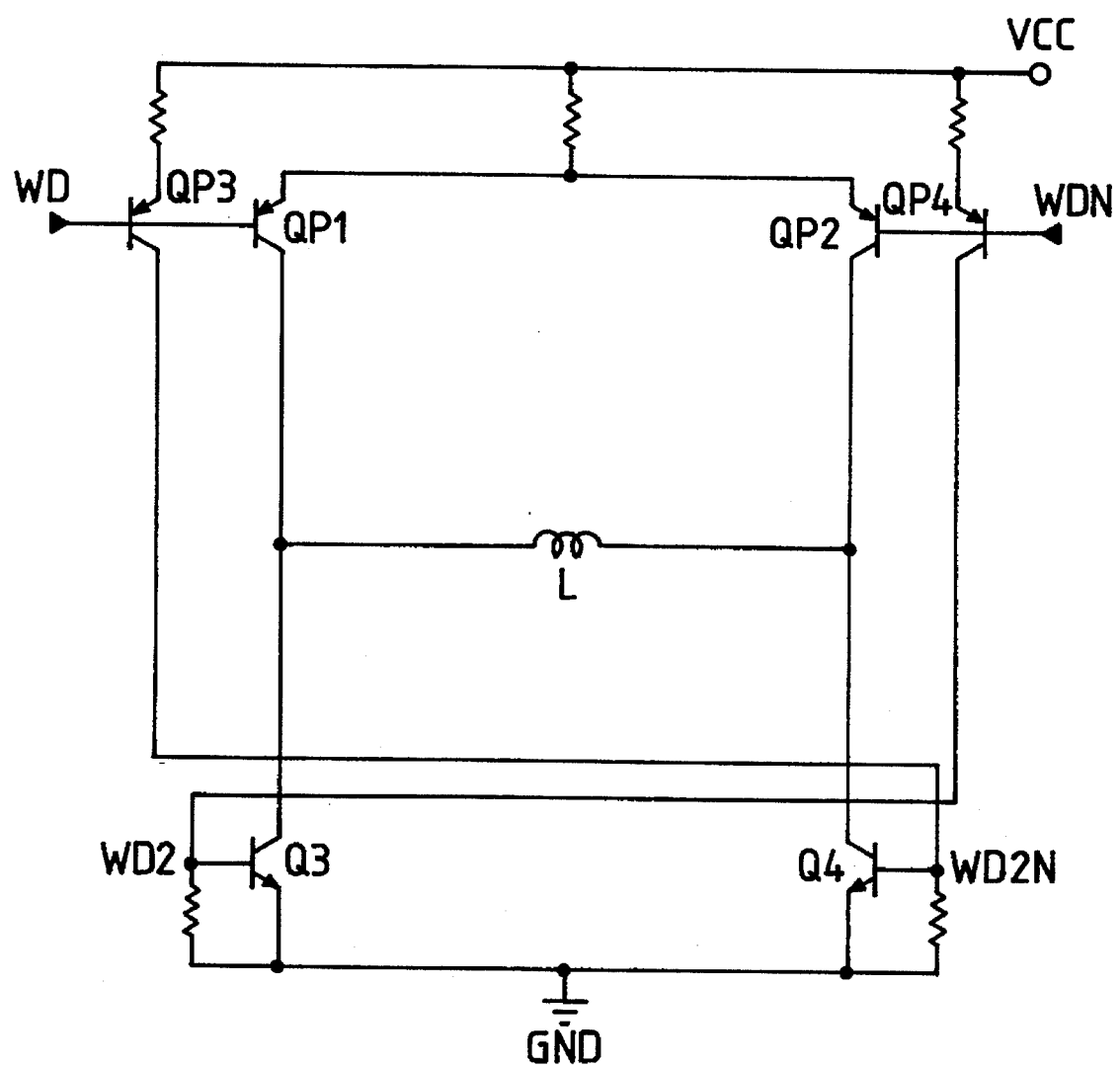
FIG. 13 is a circuit diagram showing an example of a write driver circuit that the present inventors studies prior to the present invention.

FIG. 12 is a block diagram of an embodiment of a read/write integrated circuit in which the write driver circuit of the invention is mounted and its external circuit. A read/write integrated circuit IC according to the present invention comprises a plurality of head circuits 4. More specifically, there are provided, in addition to an MR head 1 and its read amplifier 2, for example, seven MR heads and their respective read amplifiers as shown in FIG. 12. Further, one post amplifier output circuit 8 is commonly used for the eight circuits in total, the read amplifier 2 of FIGS. 12 including a level shift circuit.

A pair of output signals of the postamplifier output circuit 8 are supplied to an AGC (Automatic Gain Control) amplifier 11 via respective capacitors having a relatively large capacitance value so as to cut a DC output offset. The output signals of the AGC amplifier 11 are subjected to waveform shaping in a waveform shaping circuit 12 and then converted to pulse signals by a pulse circuit 13 before being transmitted to the host circuit 15 such as a magnetic disk control circuit.

In order to increase the storage capacity of the magnetic disk apparatus, the plurality of read/write integrated circuits IC are mounted and the outputs of the postamplifier output circuit 8 are connected to the postamplifier output circuits of the read/write integrated circuits through common output terminals. In order for only the output signals of a selected read/write integrated circuit to be transmitted to the AGC amplifier via the respective capacitors, the postamplifier output circuit 8 is allowed to have a three-state output function. In other words, the post amplifier output circuit 8 of the read/write integrated circuit IC placed in a non-selection state is such that the impedance of its outputs is set high.

The complementary input data D, DN supplied from the host circuit 15 are supplied to a write correction circuit 14.

The write correction circuit 14 is used for correcting the complementary input data D, DN beforehand in accordance with the magnetic characteristics. A write system circuit contained in the read/write integrated circuit includes a frequency divider circuit 6 and the write driver circuit 7. The frequency divider circuit is used for restoring the double-frequency of each of the complementary input data D, DN which is output from, for example, the write correction circuit 14 to the original frequency to supply the restored complementary input data D, DN to each write driver circuit 7. As described above, the output of the frequency divider circuit 6 is commonly transmitted to the plurality of write driver circuits 7, and the write driver 7 corresponding to the magnetic head selected by a selection signal (not shown) is activated, so that the magnetic head 5 is driven. The frequency divider circuit 6 is adapted for use in reducing the current of the current source to minute one in non-write condition to reduce power consumption and causing the normal current to flow only in write condition. In other words, such an extremely small current is supplied to the frequency divider circuit 6 in the non-write condition, whereas the normal current is supplied thereto in the write condition. Reference numeral 9 denotes an abnormality detection circuit for detecting, for example, the disconnections and short-circuiting of the MR head 2 and the magnetic head 5; and 10, a mode switching circuit for switching a write mode to a read mode and vice versa according to a switching signal supplied from the host circuit 15.

The effect obtained from the embodiments of the present invention includes the following:

(1) The first and second npn type output transistors in the inverted Darlington form are each provided for the first and second pnp type input transistors whose bases are supplied with the respective complementary input signals in pair. The first resistor element is provided between the emitter of the pnp type input transistor and the collector of the corresponding npn type output transistor, whereas the second resistor element is provided between the common collectors of the first and second npn type output transistors and the supply voltage, the clamp voltage being supplied to the collectors of the first and second pnp type input transistors. Further, there are provided the third and fourth npn type output transistors connected to the first and second npn type output transistors in series and subjected to complementary switching control. The connection between the first and third output transistors and the connection between the second and fourth output transistors are each used as the first and second output terminals, and the respective inductive heads are connected therebetween, whereby the voltage between the output terminals at the time the current is switched can be set higher than the supply voltage in response to the withstand voltage between the base and emitter of the npn type output transistor. The high-speed switching of the write current is thus made possible. In the circuit kept open during the multi servo operation, the current limitation can effectively be carried out by the first resistor element provided for the emitter of the pnp type input transistor.

(2) Due to the current limiting operation of (1), the plurality of write driver circuits can be actuated collectively so as to have the multi servo function effectively by means of the small-sized first and second pnp type input transistors.

(3) The dumping resistor element and the unidirectional element for supplying the current from the power supply terminal to the output terminal are connected in series between the first and second power supplies for forming the voltage varying with the input signals corresponding to the first and second output terminals with the effect of preventing the reactive current from steadily flowing into the dumping resistor.

(4) The voltage supplied to the dumping resistor element is formed by means of the voltage source circuit comprising the inverted Darlington circuit including the pnp type input transistor for receiving the pair of complementary input signals and the npn type output transistor supplied with the collector output of the pnp type input transistor, and the serial diode provided for the collector of the pnp type input transistor and used to form the constant voltage to form the voltage supplied to the dumping resistor element. Further, by passing the current through the serial diode and supplying the current to the current mirror circuit to utilize the output current as the bias current for extracting the base currents of the first and second npn type output transistors, it is made possible to reduce the reactive current because of the dumping resistor and to increase the speed of the current switching operation effectively.

(5) The third and fourth pnp type input transistors, the third and fourth npn type output transistors, and the third and fourth resistor elements are used, these elements being substantially similar in configuration to the first and second pnp type input transistors, the first and second npn type output transistors, and the first and second resistor elements. The resistance values of the third and fourth resistor elements are set so that the resistance values are made greater than those of the first and second resistor elements at a desired ratio. To the third pnp type input transistor and the third npn type output transistor, and the fourth pnp type input transistor and the npn type output transistor, the first and second constant voltage are supplied in a switching mode by means of the differential current switching circuit for receiving the complementary input signals with the effect of obtaining the write current and the bias current that have been set highly precisely.

(6) The first and second constant current sources are formed so that they are set at a predetermined current ratio by the current mirror circuit on the basis of the reference current set by the external resistor, with the effect of forming an appropriate write current and bias current with high precision.

Although the embodiments of the present invention made by the present inventors have been described in concrete terms, the invention is not limited to the embodiments as set forth above but may be modified in various manners without departing from the scope and spirit thereof. In FIG. 11, for example, the resistors 10×Ra, 10×R1 may be adapted for common use as the constant currents IP1, IN1 are allowed to flow into one of the circuits because of the differential transistors Q15~Q18 for switching the current; in other words, the number of elements may be decreased by providing a circuit similar to what is shown in the embodiment of FIG. 3. The number of heads connected to the read/write integrated circuits may be set as required. The present invention is widely applicable to write driver circuits.

A brief description will subsequently be given of the effect achievable by an exemplary embodiment of the invention as disclosed in the present application for a patent. The first and the second npn type output transistor in the inverted Darlington form are provided for the first and second pnp type input transistors whose bases are respectively supplied with the complementary input signals in pair. Further, the first resistor element is provided between the emitter of the pnp type input transistor and the collector of the corresponding npn type output transistor, whereas the second resistor element is provided between the common collectors of the first and second npn type output transistors and the supply voltage, the clamp voltage being supplied to the collectors of the first and second pnp type input transistors. Further, there are provided the third and fourth npn type output transistors connected to the first and second npn type output transistors in series and subjected to complementary switching control, and the connection between the first and third output transistors and the connection between the second and fourth output transistors are each used as the first and second output terminals, and respective inductive heads are connected therebetween, whereby since the voltage between the output terminals at the time the current is switched can be set higher than the supply voltage in response to the withstand voltage between the base and emitter of the npn type output transistor, the high-speed switching of the write current is made possible. In the circuit kept open during the multi servo operation, the current limitation can effectively be carried out by the first resistor element provided for the emitter of the pnp type input transistor.

Due to the current limiting operation above, the plurality of write driver circuits can be actuated collectively so as to have the multi servo function effectively by means of the small-sized first and second pnp type input transistors.

The dumping resistor element and the unidirectional element for supplying the current from the power supply terminal to the output terminal are connected in series between the first and second power supplies for forming the voltage varying with the input signals corresponding to the first and second output terminals, whereby the reactive current is prevented from steadily flowing into the dumping resistor.

The voltage supplied to the dumping resistor element is formed by means of the voltage source circuit comprising the inverted Darlington circuit including the pnp type input transistor for receiving the pair of complementary input signals and the npn type output transistor supplied at the base with the collector output of the pnp type input transistor, and the serial diode provided for the collector of the pnp type input transistor and used to form the constant voltage to form the voltage supplied to the dumping resistor element. Further, by passing the current through the serial diode and supplying the current to the current mirror circuit to utilize the output current as the bias current for extracting the base currents of the first and second npn type output transistors, it is made possible to reduce the reactive current because of the dumping resistor and to increase the speed of the current switching operation effectively.

The third and fourth pnp type input transistors, the third and fourth npn type output transistors, and the third and fourth resistor elements are used, these elements being substantially similar in configuration to the first and second pnp type input transistors, the first and second npn type output transistors, and the first and second resistor elements. The resistance values of the third and fourth resistor elements are set so that the resistance values are made greater than those of the first and second resistor elements at a desired ratio. To the third pnp type input transistor and the third npn type output transistor, and the fourth pnp type input transistor and the npn type output transistor, the first and second constant voltage are supplied in a switching mode by means of the differential current switching circuit for receiving the complementary input signals, whereby the write current and the bias current that have been set highly precisely can be obtained.

The first and second constant current sources are formed so that they are made to have a predetermined current ratio by the current mirror circuit on the basis of the reference current set by the external resistor, whereby an appropriate write current and bias current can be formed with high precision.

What is claimed is:

1. A write driver comprising:

first and second pnp type transistors whose bases are supplied with respective complementary input signals in pair, first and second npn type transistors whose bases are connected to respective collectors of the first and second pnp type transistors, first resistor elements each connected between the emitters of the first and second pnp type transistors and the collectors of the first and second npn type transistors, a second resistor element connected to the collectors of the first and second npn type transistors and an external power supply terminal to which a first supply voltage is supplied, the collectors thereof being commonly connected, third and fourth npn type transistors which are each connected to the first and second npn type transistors in series and subjected to complementary switching control by inverted signals of the corresponding input signals, and an inductive head connected between a first output terminal provided at the connection between the first and third npn type transistors, and a second output terminal provided at the connection between the second and fourth npn type transistors.

2. A write driver according to claim 1, further comprising:

clamp circuits connected to respective collectors of the first and second pnp type transistors so as to prevent the first and second pnp type transistors from being saturated, wherein a clamp circuit has a third and a fourth pnp type transistor whose bases are supplied with clamp voltage.

3. A write driver according to claim 1, further comprising:

third and fourth resistor elements and unidirectional elements provided between the first and second output terminals and first and second internal power supply terminals to which second and third supply voltages each varying with the input signals are supplied, the unidirectional elements causing currents to flow from the first and second internal power supply terminals to the first and second output terminals.

4. A write driver according to claim 3, wherein the third and fourth resistor elements are dumping resistor elements.

5. A write driver according to claim 2, further comprising:

third and fourth resistor elements and unidirectional elements provided between the first and second output terminals and first and second internal power supply terminals to which second and third supply voltages each varying with the input signals are supplied, the unidirectional elements causing currents to flow from the first and second internal power supply terminals to the first and second output terminals.

6. A write driver according to claim 5, wherein the third and fourth resistor elements are dumping resistor elements.

7. A write driver according to claim 6, further comprising:

inverted Darlington circuits each including fifth and sixth pnp type transistors whose bases are supplied with the input signals, and fifth and sixth npn type transistors whose bases are connected to the collectors of the fifth and sixth pnp type transistors, voltage source circuits each including serial diodes connected to the collectors of the fifth and sixth pnp type transistors and forming constant voltages, and a current mirror circuit supplied with the current flowing through the serial diodes, wherein the fifth and sixth npn type transistors each supply the second and third supply voltages from their emitters to the dumping resistor elements and wherein the output current of the current mirror circuit is bias current for extracting the base currents of the first and second npn type transistors.

8. A write driver according to claim 7, further comprising:

seventh and eighth pnp type transistors whose bases are connected to respective bases of the fifth and sixth pnp type transistors, seventh and eight npn type transistors whose bases are connected to respective collectors of the seventh and eighth pnp type transistors, fifth and sixth resistor elements each connected between the seventh and eighth pnp type transistors and the seventh and eighth npn type transistors, ninth and tenth pnp type transistors whose emitters are connected to respective bases of the seventh and eighth pnp type transistors and whose bases are connected to respective emitters of the seventh and eighth npn type transistors, and first and second constant current sources respectively forming first and second constant currents according to complementary input data, wherein the pair of complementary input signals are formed by selectively supplying the first and second constant currents each to the seventh pnp type transistor and the seventh npn type transistor, and the eighth pnp type transistor and the eighth npn type transistor according to the complementary input data.

9. A semiconductor integrated circuit device comprising:

a plurality of write driver circuits driving a magnetic head for writing data to a plurality of magnetic disks, respectively, and a mode switching circuit for setting a write mode for simultaneously placing the plurality of write driver circuits in operating condition, wherein each of the plurality of write driver circuits includes:

first and second pnp type transistors whose bases are each supplied with a pair of complementary input signals, first and second npn type transistors whose bases are connected to respective collectors of the first and second pnp type transistors, first resistor elements each connected between the emitters of the first and second pnp type transistors and the collectors of the first and second npn type transistors, second resistor elements each connected between the commonly connected collectors of the first and second npn type transistors and an external power supply terminal supplied with a first supply voltage, third and fourth npn type transistors each connected to the first and second npn type transistors in series and subjected to complementary switching control by means of inverted signals of the corresponding input signals, and an inductive head connected between a first output terminal provided at the connection between the first and third npn type transistors and a second output terminal provided at the connection between the second and fourth npn type transistors.

* * * * *